United States Patent
Luo et al.

(10) Patent No.: US 11,834,346 B2
(45) Date of Patent: Dec. 5, 2023

(54) SEMICONDUCTOR ELECTROTHERMAL FILM PRECURSOR SOLUTION AND PREPARATION METHOD OF SEMICONDUCTOR ELECTROTHERMAL FILM STRUCTURE AND ELECTROTHERMAL STRUCTURE

(71) Applicant: FUJIAN JINGXI NEW MATERIAL TECHNOLOGY CO., LTD., Longyan (CN)

(72) Inventors: Hao Luo, Shenzhen (CN); Jiancai Cai, Zhangzhou (CN); Xiaohua Yang, Longyan (CN)

(73) Assignee: FUJIAN JINGXI NEW MATERIAL TECHNOLOGY CO., LTD., Longyan (CN)

( * ) Notice: Subject to any disclaimer, the term of this patent is extended or adjusted under 35 U.S.C. 154(b) by 309 days.

(21) Appl. No.: 17/383,418

(22) Filed: Jul. 22, 2021

(65) Prior Publication Data
US 2022/0356073 A1 Nov. 10, 2022

(30) Foreign Application Priority Data

May 7, 2021 (CN) .......................... 202110495861.1
Jul. 8, 2021 (CN) .......................... 202110772226.3

(51) Int. Cl.
*H01B 1/08* (2006.01)
*C01G 30/00* (2006.01)
(Continued)

(52) U.S. Cl.
CPC ............. *C01G 30/026* (2013.01); *B05D 5/12* (2013.01); *H01B 1/08* (2013.01);
(Continued)

(58) Field of Classification Search
CPC ... H01B 1/00; H01B 1/08; H01B 1/22; C01G 30/026; H01L 21/02565; B05D 5/12
See application file for complete search history.

(56) References Cited

U.S. PATENT DOCUMENTS

| | | | | |
|---|---|---|---|---|
| 2006/0076325 A1* | 4/2006 | Lin | .......................... | H05B 3/26 219/121.45 |
| 2007/0105285 A1* | 5/2007 | Kusumoto | ............. | H10K 71/80 257/E29.147 |
| 2018/0042424 A1* | 2/2018 | Yin | ...................... | H05B 6/1209 |

FOREIGN PATENT DOCUMENTS

| CN | 104080208 B | * | 4/2015 |
|---|---|---|---|
| CN | 111970772 A | * | 11/2020 |
| EP | 3245921 A1 | * | 11/2017 |

OTHER PUBLICATIONS

Sabnis et al "Process flow of spray pyrolysis technique", IOSR Journal of Applied Physics, vol. 4, Issue 5, pp. 07-11, 2013.*

* cited by examiner

*Primary Examiner* — Mark Kopec

(57) ABSTRACT

The present disclosure provides a precursor solution of a semiconductor electrothermal film, which comprises component A, component B, and component C. The component A comprises the following components by weight: 2-10 parts of tin tetrachloride pentahydrate, 3-6 parts of stannous chloride and 0.3-1 part of glycerol, also comprises a pH regulator, the pH of the component A is 4.7-6.2; the component B comprises the following components by weight: 5-10 parts of conductivity regulator, the conductivity regulator is selected from a group consisting of antimony trichloride dihydrate, bismuth trioxide, aluminum oxide and thallium dioxide, 0.6-1 part chlorinated aluminum and a mixture thereof, also comprises a pH regulator, the pH of the component B is 4.7-5.0; the component C comprises the following components by weight: 0.5-0.7 parts of tin oxide, (Continued)

0.8-1.5 parts of bismuth oxide and 15-25 parts of ethanol; also comprises 15-30 parts of distilled water. A preparation method of electrothermal film and electrothermal structure is further provided. The obtained semiconductor electrothermal film has good nature of resistance to sudden temperature changes, good temperature stability, attenuation resistance, fast heating speed, and high temperature resistance.

6 Claims, 1 Drawing Sheet

(51) Int. Cl.
    *B05D 5/12*     (2006.01)
    *C01G 30/02*     (2006.01)
    *H01L 21/02*     (2006.01)

(52) U.S. Cl.
    CPC .... *H01L 21/02565* (2013.01); *C01P 2002/52* (2013.01); *C01P 2006/32* (2013.01); *C01P 2006/40* (2013.01)

SEMICONDUCTOR ELECTROTHERMAL FILM PRECURSOR SOLUTION AND PREPARATION METHOD OF SEMICONDUCTOR ELECTROTHERMAL FILM STRUCTURE AND ELECTROTHERMAL STRUCTURE

TECHNICAL FIELD

The present disclosure relates to the field of semiconductor electrothermal films, and particularly relates to a semiconductor electrothermal film precursor solution and preparation method of a semiconductor electrothermal film structure and the electrothermal structure.

BACKGROUND

Compared with traditional electrothermal materials, such as resistance wire, semiconductor electrothermal film has great advantages. For example, it has higher electrothermal conversion efficiency, can achieve full surface coverage, increase heat transfer area, increase heat transfer rate, and have a longer service life. Which can be used in the heating atomizer of electronic cigarettes, but the working temperature of the semiconductor electrothermal film is usually 100-300° C., which is relatively low compared to the working temperature of the resistance wire of 100-1000° C.

In addition, the current tin oxide type electrothermal film has a relatively obvious resistance change above 500° C., and the attenuation is relatively severe, which limits the application range of the tin oxide type electrothermal film.

In addition, the heating rate of the electrothermal film is relatively slow, and the temperature is unstable in a short period of time, and it is easy to produce carcinogens when used in electronic cigarettes.

At present, the inorganic electrothermal film usually uses tin chloride pentahydrate or tin chloride or stannous chloride as the main component. The weight parts are usually 10-60 parts according to the formula, and the tin oxide electrothermal film is formed by hydrolysis. The doping method improves the performance of the electrothermal film, but the doping of this component cannot solve the above technical problems.

Therefore, it is necessary to provide a new precursor solution for the semiconductor electrothermal film. As a further step, it is necessary to provide a method for preparing a semiconductor electrothermal film structure. As a further step, it is also necessary to provide a method for preparing an electrothermal structure.

SUMMARY

The first object of the present disclosure is to provide a precursor solution for a semiconductor electrothermal film to solve the problems raised in the background art.

In order to achieve the above objective, the present disclosure provides a semiconductor electrothermal film precursor solution, comprising component A, component B and component C, wherein, The component A comprises the following components in parts by weight: 2-10 parts of tin tetrachloride pentahydrate, 3-6 parts of stannous chloride and 0.3-1 parts of glycerol, and also comprises a pH regulator, a pH of the component A is 4.7-6.2;

The component B comprises the following components by weight: 5-10 parts of a conductivity regulator, the conductivity regulator is selected from a group consisting of antimony trichloride dihydrate, bismuth trioxide, aluminum oxide, thallium dioxide and a mixture thereof, 0.6-1 part of aluminum chloride, also comprising a pH regulator, a pH of the component B is 4.7-5.0;

The component C comprises the following components in parts by weight: 0.5-0.7 parts of tin oxide, 0.8-1.5 parts of bismuth oxide, and 15-25 parts of ethanol;

Also comprises 15-30 parts of distilled water.

The second object of the present disclosure is to provide a method for preparing a semiconductor electrothermal film structure, comprising the above-mentioned semiconductor electrothermal film precursor solution, it comprises the following steps:

Preparation of precursor solution for semiconductor electrothermal film:

Step One:
According to the proportion, take the pentahydrate tin tetrachloride and stannous chloride, mix them thoroughly, add them to the pH regulator, control the pH value to 4.7-6.2, control temperature at 8-12° C., stir until completely dissolved, add propanetriol according to the proportion, continue to stir for 5-10 minutes to obtain component A;

Add a proportion of conductivity regulator and aluminum chloride to the pH regulator, and the conductivity regulator is selected from a group consisting of antimony trichloride dihydrate, bismuth trioxide, aluminum trioxide, thallium dioxide and a mixture thereof, control pH value at 4.7-5.0, control temperature at 15-20° C., stir evenly to obtain component B;

Take ethanol according to proportion, add tin oxide and bismuth oxide in proportion to the ethanol, and mix them evenly to obtain component C;

Step Two:
Add all the component A and the component B to the component C, add distilled water in proportion, and after full reaction, filter out solid particles, then obtain the semiconductor electrothermal film precursor solution;

Preparation of Semiconductor Electrothermal Film Structure:
Heat a substrate to 380-860° C., mix the semiconductor electrothermal film precursor solution is fully with 3-7 kg of air, spray on one side of the substrate with a spray gun, and cool to ambient temperature to obtain the semiconductor electrothermal film structure.

Preferably, the substrate is a ceramic material and/or glass material.

The third object of the present disclosure is to provide a method for preparing an electrothermal structure, wherein it comprises the above-mentioned method for preparing a semiconductor electrothermal film structure, and further comprises the following steps:

Preparation of an Electrode:
Print a conductive paste on the side of the semiconductor electrothermal film away from the substrate by screen printing to form a first electrode and a second electrode, the first electrode and the second electrode are arranged oppositely, and the mesh number of the screen is 80-200 mesh;

Preparation of Electrothermal Structure:
Heat the substrate coated with the semiconductor electrothermal film, the first electrode and the second electrode to 180-300° C., dry for 10-30 minutes, heat to 500-800° C., sinter for 15-30 minutes, and cool to obtain electrothermal structure.

Preferably, the conductive paste is conductive silver paste.

Preferably, the substrate is a ceramic material and/or glass material.

The above-mentioned pH regulator is used to regulate pH to prevent the premature hydrolysis of the chloride and cause deterioration. The above-mentioned pH regulator comprises, but not limited to, hydrochloric acid, glacial acetic acid, nitric acid, chloric acid, phosphoric acid, pyruvic acid, nitrous acid, and formic acid.

Compared with the prior art, the beneficial technical effects of the present disclosure are:

(1) The semiconductor electrothermal film obtained by crystallization of the semiconductor electrothermal film precursor solution has the properties of resistance to sudden changes in temperature, good temperature stability, resistance to attenuation, fast heating speed, and good high temperature resistance;

(2) Providing a method for preparing a semiconductor electrothermal film structure, which can realize stable mass automated industrial production;

(3) Providing a method for preparing an electrothermal structure. The obtained electrothermal structure has the properties of resistance to sudden changes in temperature, resistance to breakdown, adaptability to large-range changes in voltage, high electrothermal conversion efficiency, and good high temperature resistance.

BRIEF DESCRIPTION OF THE DRAWINGS

In order to explain the embodiments of the present disclosure or the technical solutions in the prior art more clearly, the following will briefly introduce the drawings that need to be used in the description of the embodiments or the prior art. Obviously, the drawings in the following description are merely embodiments of the present utility model. For those of ordinary skill in the art, without inventive work, other drawings can be obtained based on the structure shown in these drawings.

Figure 1:
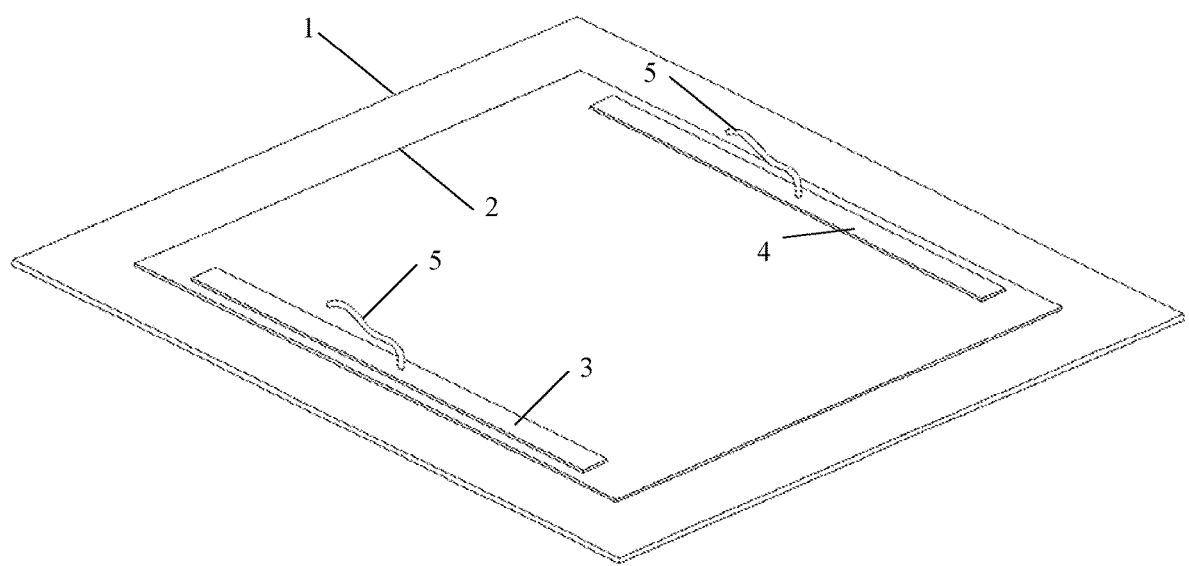
FIG. 1 is one of the structural schematic diagrams of the electrothermal structure of the embodiment of the present disclosure.

Description of reference signs: 1—substrate; 2—semiconductor electrothermal film; 3—first electrode, 4—second electrode, 5—conductive member.

DESCRIPTION OF THE EMBODIMENTS

The technical solutions in the embodiments of the present disclosure will be clearly and completely described below with reference to the accompanying drawings in the embodiments of the present disclosure. Obviously, the described embodiments are only a part of the embodiments of the present disclosure, rather than all the embodiments. Based on the embodiments of the present disclosure, all other embodiments obtained by those of ordinary skill in the art without inventive work shall fall within the protection scope of the present disclosure.

In addition, the descriptions related to "first", "second", etc. in the present disclosure are merely used for descriptive purposes, but cannot be explained as indicating or implying their relative importance or implicitly indicating the number of indicated technical features. Therefore, the features defined with "first" and "second" may explicitly or implicitly include at least one of the features.

In addition, the technical solutions between the various embodiments can be combined with each other, but it must be based on what can be achieved by a person of ordinary skill in the art. When the combination of technical solutions is contradictory or cannot be achieved, it should be considered that such a combination of technical solutions does not exist, and not within the scope of protection required by the utility model.

Example 1

A precursor solution of a semiconductor electrothermal film, comprising component A, component B and component C, wherein the component A includes the following components by weight: 2 parts of tin tetrachloride pentahydrate, 3 parts of stannous chloride, 0.3 parts of glycerol, and also include a pH regulator, which regulates pH of the component A to 4.7-6.2, and the pH regulator of the component A is glacial acetic acid;

The component B includes the following components in parts by weight: 5 parts of a conductivity regulator, the conductivity regulator is antimony trichloride dihydrate, 0.6 parts of aluminum chloride, and also includes a pH regulator, pH of the component B is 4.7-5.0, and the pH regulator of the component B is hydrochloric acid;

The component C includes the following components in weight fraction: 0.5 parts of tin oxide, 0.8 parts of bismuth oxide and 15 parts of ethanol;

It also includes 15 parts of distilled water.

Example 2

A precursor solution of a semiconductor electrothermal film, comprising component A, component B and component C, wherein the component A includes the following components by weight: 10 parts of tin tetrachloride pentahydrate, 6 parts of stannous chloride, 1 part of glycerol, and also includes a pH regulator, which regulates pH of the component A to 4.7-6.2, and the pH regulator of the component A is glacial acetic acid;

The component B includes the following components in parts by weight: 10 parts of a conductivity modifier, the conductivity modifier is antimony trichloride dihydrate, 1 part of aluminum chloride, and also includes a pH modifier, the pH of the component B is 4.7-5.0, and the pH regulator of the component B is hydrochloric acid;

The component C includes the following components in weight fraction: 0.7 parts of tin oxide, 1.5 parts of bismuth oxide and 25 parts of ethanol;

It also includes 25 parts of distilled water.

Example 3

A precursor solution of a semiconductor electrothermal film, comprising component A, component B and component C, wherein the component A includes the following components by weight: 6 parts of tin tetrachloride pentahydrate, 4.5 parts of stannous chloride, 0.65 parts of glycerin, and also include a pH regulator, which regulates pH of the component A to 4.7-6.2, and the pH regulator of the component A is glacial acetic acid;

The component B includes the following components in parts by weight: 7.5 parts of a conductivity regulator, the conductivity regulator is antimony trichloride dihydrate, 0.8 parts of aluminum chloride, and also includes a pH regulator, the pH of the component B is 4.7-5.0, and the pH regulator of the component B is hydrochloric acid;

The component C includes the following components in weight fraction: 0.6 parts of tin oxide, 1.15 parts of bismuth oxide and 20 parts of ethanol;

It also includes 22.5 parts of distilled water.

In other embodiments of the present disclosure, the conductivity modifier is selected from a group consisting of antimony trichloride dihydrate, bismuth trioxide, aluminum trioxide, thallium dioxide, and a mixture thereof.

It should be noted that the pH regulators in the component A and component B, for example, hydrochloric acid, glacial acetic acid, nitric acid, chloric acid, phosphoric acid, pyruvic acid, nitrous acid, and formic acid, play a role in regulating pH and prevent chlorine from premature hydrolysis, and causes deterioration.

The following method is used to measure the semiconductor electrothermal film obtained in the above embodiment:

Resistance value: GB/T7278-2008;
Electrothermal conversion efficiency: GB/T 7287-2008;
Normal total emissivity: B/T 7287-2008;
Value-added electrothermal conversion rate: GB/T 7287-2008;
Continuous working hours: GB/T 7287-2008;
Heating time: GB/T 7287-2008;
Dissolution of lead in acetic acid for 24 hours: GBT 3534-2002;
Dissolution of cadmium in acetic acid 24 h: GBT 3534-2002;
Destructive test: GBT 3534-2002;
Leakage current: GB/T 7287-2008;
Attenuation resistance test: GB/T 7287-2008;
Heating speed test: GB/T 7287-2008
Test Results:

short-circuit breakdown phenomenon will occur; good high temperature resistance, the destruction temperature reaches 680° C. The continuous working time is longer, more than 2000 s. The electrothermal transfer rate is higher, reaching more than 95%; the temperature sudden change resistance is good.

In addition, it also has a faster heating speed, which can reach 90% of the maximum temperature in 5 minutes, and the transparency is better, reaching 75%-88%.

And according to the composition analysis, the electrothermal film has anti-oxidation, anti-corrosion, insulation, flame-retardant, moisture-proof, high hardness, non-toxic, no harmful radiation, no discharge of undesirable substances, the power factor of heating is 1, and the heating water sample is tested as small molecular clusters, and have, far infrared rays that are most suitable for the human body to absorb.

Compared with the prior art, the present disclosure has achieved the above-mentioned beneficial technical effects, mainly because the present disclosure adjusts the proportion of tin tetrachloride pentahydrate and stannous chloride, and forms polycrystalline tin oxide and a certain amount of tin oxide and stannous oxide in a proportion after high-temperature hydrolysis, which forms an n-type conductive electrothermal film, and through the adjustment of the proportion, the conductivity of the electrothermal film formed after high-temperature hydrolysis is 8-20 $\Omega/cm^2$, and the tin oxide is changed by adjusting the type and proportion of the conductivity regulator. In the selected proportion range, the conductivity can be increased and the resistance value can be reduced at the same time to achieve rapid heating in a short time. The synergy among the above-mentioned com-

|  | Example 1 | Example 2 | Example 3 |
|---|---|---|---|
| Resistance value/Ω | 0.68 | 0.82 | 0.71 |
| Electrothermal conversion efficiency | 96.7% | 95.68% | 97.88% |
| Normal total emissivity | 0.83 (+) | 0.82 (+) | 0.85 (+) |
| Value-added electrothermal conversion rate | 32% | 31% | 33% |
| Continuous working hours/s | >2000 | >2000 | >2000 |
| Heating to 310° C. time/s | 0.34 | 0.32 | 0.30 |
| Dissolution of lead in acetic acid for 24 hours:/(ug/mL) | 2.37 | 2.31 | 2.34 |
| Dissolution of cadmium in acetic acid 24 h/(ug/mL) | 0.08 | 0.09 | 0.09 |
| Destructive temperature/° C. | 680 | 678 | 676 |
| Resistance to sudden change of temperature | Shape remains unchanges, the resistance value remains unchanged | Shape remains unchanges, the resistance value remains unchanged | Shape remains unchanges, the resistance value remains unchanged |
| Resistance to sparking | No breakdown when the single-phase grounding voltage is 10000 V for 1 min | No breakdown when the single-phase grounding voltage is 10000 V for 1 min | No breakdown when the single-phase grounding voltage is 10000 V for 1 min |
| Leakage current/A | <0.25 mA | <0.25 mA | <0.25 mA |
| Resistance to attenuation | The resistance does not change after intermittent use for 2000 h | The resistance does not change after intermittent use for 2000 h | The resistance does not change after intermittent use for 2000 h |
| Heating rate | In 5 minutes it can reach 90% of the maximum temperature | In 5 minutes it can reach 90% of the maximum temperature | In 5 minutes it can reach 90% of the maximum temperature |
| Transparency | 88% | 87% | 85% |

Analysis of the Above Test Results Shows that:

The electrothermal film has the following properties: the resistance value is as low as 0.7Ω; the heating is fast, and the temperature can be increased to 200-310° C. in about 0.4 s at the moment of power-on; breakdown resistance, working voltage and leakage current meet the standards, and no ponents and the selected proportion of aluminum chloride (hydrolyzed into aluminum oxide at high temperature), tin oxide and bismuth oxide reduces the temperature coefficient of the semiconductor electrothermal film, and increases the resistance to sudden temperature changes and attenuation of the semiconductor electrothermal film.

The present disclosure also provides a method for preparing a semiconductor electrothermal film structure, which includes the precursor solution of the above-mentioned semiconductor electrothermal film.

Example 4

A method for preparing a precursor solution of a semiconductor electrothermal film includes the following steps:
Step One:
According to the proportion, take the pentahydrate tin tetrachloride and stannous chloride, mix them thoroughly, add them to the pH regulator, control the pH value to 4.7-6.2, control the temperature at 8-12° C., stir until completely dissolved, add the propanetriol according to the proportion, continue to stir for 5-10 minutes to obtain component A;
Add a proportion of conductivity regulator and aluminum chloride to the pH regulator and the conductivity regulator is selected from a group consisting of antimony trichloride dihydrate, bismuth trioxide, aluminum trioxide, thallium dioxide, and a mixture thereof. Control the pH value at 4.7-5.0, control the temperature at 15-20° C., stir evenly to obtain the component B;
Take ethanol according to proportion, and add tin oxide and bismuth oxide in proportion to the ethanol to obtain component C;
Step Two:
Add all the component A and the component B to the component C, add the proportioned distilled water, and after a full reaction, filter out the solid particles to obtain the semiconductor electrothermal film precursor solution;
Preparation of semiconductor electrothermal film structure:
Heat the substrate to 380-860° C., mix the semiconductor electrothermal film precursor solution fully with 3-7 kg of air, spray on one side of the substrate with a spray gun, and cool to ambient temperature to obtain the semiconductor electrothermal film structure.
The specific proportion is the same as that of Example 1, and the substrate is made of ceramic material and/or glass material.

Example 5

The steps of the preparation method of the semiconductor electrothermal film structure are the same as those of the embodiment 4, and the specific proportion is the same as that of the embodiment 2.

Example 6

The steps of the preparation method of the semiconductor electrothermal film structure are the same as those of the embodiment 4, and the specific proportion is the same as that of the embodiment 3.

It should be noted that in the above embodiment, the substrate is heated to 380-860° C. because the suitable temperature of the semiconductor electrothermal film precursor solution obtained according to proportion is 380-860° C. The temperature adjustment reduces the resistance difference on electrothermal film, lower the possibility of burning. The temperature is lower than the above value; the film forming effect is poor. The choice of air proportion affects the atomization pressure of the precursor solution. When the proportion is lower than the selected proportion, the atomization will be insufficient, causing the unevenness of the coating. If the proportion is higher than the selected proportion, the air pressure will be too high, which will dilute the reagent components in the atomization, resulting in the presence of most of the air, and the amount of the reagent becomes too small to form a film, and the air should be dry, it must not be mixed with impurities such as water vapor, otherwise the composition proportion of the precursor solution will be affected when it is mixed.

The present disclosure also provides a method for preparing an electrothermal structure, including the above-mentioned method for preparing a semiconductor electrothermal film structure.

Example 7

A method for preparing an electrothermal structure includes the method for preparing a semiconductor electrothermal film structure of the above-mentioned embodiment, and further includes the following steps:
Preparation of the Electrode:
The conductive paste is printed on the side of the semiconductor electrothermal film away from the substrate by screen printing to form the first electrode and the second electrode, and the first electrode and the second electrode are arranged oppositely, and the mesh number of the screen is 80-200 mesh;
Preparation of Electrothermal Structure:
Heat the substrate coated with the semiconductor electrothermal film, the first electrode and the second electrode to 180-300° C., dry for 10-30 minutes, heat to 500-800° C. for 15-30 minutes, and cool to obtain the electrothermal structure. The substrate is a ceramic material and/or a glass material, and the conductive paste is a conductive silver paste.

In Example 7, the mesh size of the screen is 80-200, and the thickness of the electrode can be controlled. The thickness of the electrode affects the voltage and current carried by the electrode. The proportion of the above-mentioned components is the same as that of Example 1.

Example 8

The difference from Example 7 is the proportion of the components of the semiconductor electrothermal film. The proportion of this example is the same as that of Example 2.

Example 9

The difference from Example 7 is the composition proportion of the semiconductor electrothermal film precursor solution. The composition proportion of this example is the same as that of Example 3.

Figure 2:
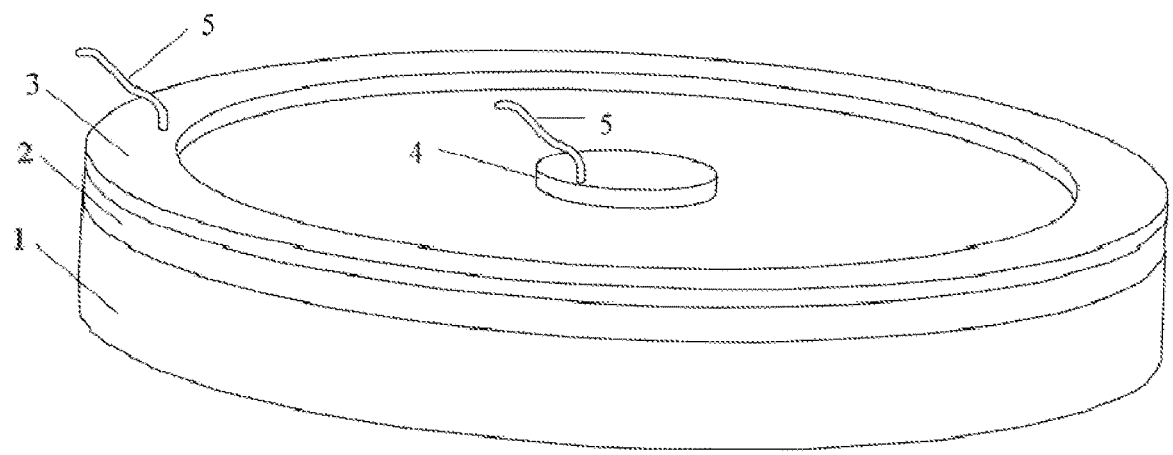
FIG. 2 is the second structural diagram of the electrothermal structure according to the embodiment of the present disclosure.

The electrothermal structure obtained in the above embodiment refer to FIG. 1 and FIG. 2, including a substrate 1, a first electrode 3, a second motor 4, and a semiconductor electrothermal film 2. The semiconductor electrothermal film 2 is coated on one side of the substrate 1. It is characterized in that the semiconductor electrothermal film 1 is obtained by the preparation method of the above embodiment, the first electrode 3 and the second electrode 4 are arranged on the side of the semiconductor electrothermal film 2 away from the substrate 1, and the first electrode 3 and the second electrode 4 are arranged opposite to each other, and further includes a conductive member 5 arranged on the first electrode 3 and the second electrode 4, which is used to transmit the electric energy of the external power source to the first electrode 3 and the second electrode. 4.

The substrate 1 is a ceramic material and/or glass material, the material of the substrate 1 can be changed according to actual use, and the electrothermal structure in which the substrate 1 is made of a ceramic material can be used as an atomizer of an electronic cigarette.

The first electrode 3 and the second electrode 4 are made of silver material, mainly because silver has the properties of high temperature resistance, resistance to sudden temperature changes, moisture resistance and oxidation resistance.

As an electronic cigarette atomizer, in order to facilitate the placement of atomized substances, a receiving cavity is provided in the substrate 1.

It should be noted that, according to actual use, the thickness and shape of the substrate 1 can be varied, and the shape and position of the first electrode 3 and the second electrode 4 can be adjusted. Referring to FIG. 1, the first electrode 3 and the second electrode 4 have a square structure, and the first electrode 3 and the second electrode 4 are arranged opposite to each other in parallel, the first electrode 3 and the second electrode 4 can also be other shapes and other forms of opposite arrangement, refer to 2, for example, the first electrode 3 has a ring structure, for example, a circular ring, the second electrode 4 has a circular structure, and the second electrode 4 is arranged in the ring of the first electrode 3.

It should be noted that the conductive member 5 includes but is not limited to a wire and a conductive sheet, and the installation method of the conductive member 5 includes, but is not limited to, magnetic attraction, thimble, buckle, and soldering.

The above are only the preferred embodiments of the present disclosure, and do not limit the scope of the present disclosure. Under the inventive concept of the present disclosure, equivalent structural transformations made by using the contents of the description and drawings of the present disclosure, or direct/indirect use in all other related technical fields are included in the scope of patent protection of the present disclosure.

What is claimed is:

1. A precursor solution of a semiconductor electrothermal film, comprising: a solution; wherein the solution is filtered from reactant obtained by fully reacting component A, component B, component C, and 15-30 parts of distilled water by weight; wherein
    the component A comprises following components in parts by weight: 2-10 parts of tin tetrachloride pentahydrate, 3-6 parts of stannous chloride and 0.3-1 parts of glycerol, and also comprises a pH regulator, a pH of the component A is 4.7-6.2;
    the component B comprises following components by weight: 5-10 parts of a conductivity regulator, the conductivity regulator is selected from a group consisting of antimony trichloride dihydrate, bismuth trioxide, aluminum oxide, thallium dioxide and a mixture thereof, 0.6-1 part of aluminum chloride, also comprising a pH regulator, a pH of the component B is 4.7-5.0; and
    the component C comprises following components in parts by weight: 0.5-0.7 parts of tin oxide, 0.8-1.5 parts of bismuth oxide, and 15-25 parts of ethanol.

2. A method for preparing a semiconductor electrothermal film structure, comprising following steps:
    preparing the precursor solution for the semiconductor electrothermal film according to claim 1; and
    preparing the semiconductor electrothermal film structure;
    wherein a step of preparing the precursor solution for the semiconductor electrothermal film comprise:
    according to proportion, mixing pentahydrate tin tetrachloride and stannous chloride, adding them to the pH regulator, controlling the pH value to 4.7-6.2, controlling temperature at 8-12° C., stirring until completely dissolved, adding propanetriol according to proportion, continue to stir for 5-10 minutes to obtain component A;
    adding a proportion of conductivity regulator and aluminum chloride to the pH regulator, controlling the pH value at 4.7-5.0, controlling temperature at 15-20° C., stirring evenly to obtain component B; wherein the conductivity regulator is selected from a group consisting of antimony trichloride dihydrate, bismuth trioxide, aluminum trioxide, thallium dioxide and a mixture thereof,
    taking ethanol according to proportion, adding tin oxide and bismuth oxide in proportion to the ethanol, and mixing them evenly to obtain component C;
    adding all the component A and the component B to the component C, adding distilled water in proportion, and after full reaction, filtering out solid particles, then obtaining the precursor solution for the semiconductor electrothermal film;
    wherein a step of preparing the semiconductor electrothermal film structure: comprises:
    heating a substrate to 380-860° C., mixing the precursor solution for the semiconductor electrothermal film fully with 3-7 kg of air, spraying on one side of the substrate with a spray gun, and cooling to ambient temperature to obtain the semiconductor electrothermal film structure.

3. The method for preparing the semiconductor electrothermal film structure according to claim 2, wherein the substrate is a ceramic material and/or a glass material.

4. A method for manufacturing an electrothermal structure, wherein, comprising the method for manufacturing the semiconductor electrothermal film structure according to claim 2, and further comprising following steps:
    preparing an electrode; and
    preparing the electrothermal structure;
    wherein a step of preparing an electrode comprises:
    printing a conductive paste on the side of the semiconductor electrothermal film away from the substrate by screen printing to form a first electrode and a second electrode, where the first electrode and the second electrode are arranged oppositely, and the mesh number of the screen is 80-200 mesh;
    wherein a step of preparing the electrothermal structure comprises:
    heating the substrate coated with the semiconductor electrothermal film, the first electrode, and the second electrode to 180-300° C., drying for 10-30 minutes, heating to 500-800° C., sintering for 15-30 minutes, and cooling to obtain electrothermal structure.

5. The method for preparing the electrothermal structure according to claim 4, wherein the conductive paste is conductive silver paste.

6. The method for preparing the electrothermal structure according to claim 4, wherein the substrate is a ceramic material and/or a glass material.

* * * * *